(12) United States Patent
Deng et al.

(10) Patent No.: US 8,648,913 B2
(45) Date of Patent: Feb. 11, 2014

(54) MISSING CODE REDISTRIBUTION IN PIPELINE ANALOG TO DIGITAL CONVERTER

(75) Inventors: Liping Deng, Cupertino, CA (US); Tie Jun Dai, Santa Clara, CA (US); Bi Yuan, San Jose, CA (US); Chien-Chen Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 376 days.

(21) Appl. No.: 13/088,221

(22) Filed: Apr. 15, 2011

(65) Prior Publication Data

US 2012/0262614 A1 Oct. 18, 2012

(51) Int. Cl.
*H03M 1/38* (2006.01)
(52) U.S. Cl.
USPC .......................................... 348/161; 348/302
(58) Field of Classification Search
USPC ................................. 348/302; 341/143, 161
See application file for complete search history.

(56) References Cited

U.S. PATENT DOCUMENTS

| 7,128,270 | B2 * | 10/2006 | Silverbrook et al. ..... 235/472.01 |
| 7,561,095 | B2 | 7/2009 | Sasaki et al. |
| 7,898,449 | B2 | 3/2011 | Kawahito et al. |
| 7,898,452 | B2 | 3/2011 | Lewis et al. |
| 7,903,017 | B2 | 3/2011 | Hsieh et al. |
| 8,023,020 | B2 * | 9/2011 | Moini et al. .................. 348/294 |
| 2006/0114144 | A1 * | 6/2006 | Lyden et al. .................. 341/161 |
| 2007/0052573 | A1 * | 3/2007 | Lin ............................... 341/161 |
| 2009/0135037 | A1 * | 5/2009 | Agarwal et al. ............... 341/143 |
| 2011/0001647 | A1 | 1/2011 | Veeder et al. |
| 2011/0012765 | A1 * | 1/2011 | Hsieh et al. ................... 341/143 |

* cited by examiner

*Primary Examiner* — Twyler Haskins
*Assistant Examiner* — Fayez Bhuiyan
(74) *Attorney, Agent, or Firm* — Blakely Sokoloff Taylor & Zafman LLP

(57) ABSTRACT

A stage of pipeline analog to digital converter (ADC) includes a multiplying digital to analog converter (MDAC) and a sub-analog to digital converter (sub-ADC). The sub-ADC includes a comparator and a random offset controller. The comparator is coupled to compare a first analog signal received by the stage with a reference signal. The random offset controller is coupled to the comparator to apply a random offset to an input of the comparator to randomly distribute errors by the sub-ADC in a digital output of the pipeline ADC.

16 Claims, 10 Drawing Sheets

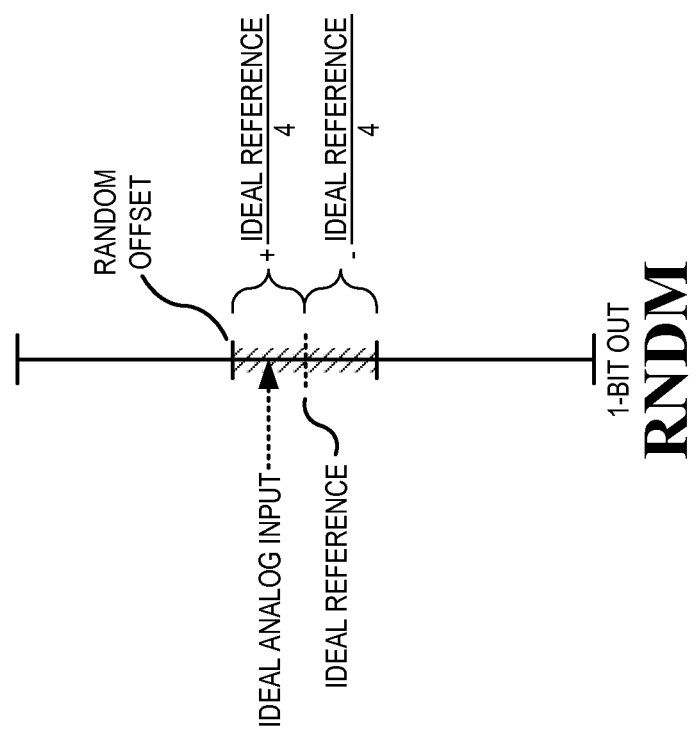

MISSING CODE REDISTRIBUTION IN PIPELINE ANALOG TO DIGITAL CONVERTER

TECHNICAL FIELD

This disclosure relates generally to pipeline analog to digital converters (ADCs) and in particular but not exclusively, relates to pipeline ADCs used in readout circuitry of an image sensor.

BACKGROUND INFORMATION

Due to their relatively simple implementation and low cost in the application of intermediate speed and resolution, pipeline analog-to-digital converters (ADC) are found in various applications including image sensors, communications equipment, and televisions. Because of the pipeline ADC's piecewise linear nature, missing codes (i.e., errors in the digital output) caused by capacitor mismatch, limited operational-amplifier (OP-AMP) gain, settling errors and inaccurate reference voltages are more pronounced. As a result, missing codes (especially those found in the earlier stages of a pipeline ADC) could significantly degrade the digital output, such as the visual quality of an image produced by an image sensor.

Degradation in the visual quality of an image or missing codes are typically reduced with calibration circuits included in the pipeline ADC. However, calibration circuits take up space on the image sensor die and increase the power consumption of the image sensor.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 5D illustrates the effects of a random offset applied to an input of a comparator of a sub-ADC in accordance with an embodiment of the invention.

DETAILED DESCRIPTION

Embodiments of a pipeline analog to digital converter (ADC) with missing code redistribution are described herein. Embodiments of the pipeline ADC disclosed herein randomize an offset applied to a comparator included in a sub-analog to digital converter (sub-ADC) of the pipeline ADC to redistribute errors in the digital output of the pipeline ADC. Thus, in an embodiment where the pipeline ADC is included in an image sensor, missing codes (or errors) are spread throughout the resultant image such that errors become less visible or even invisible.

In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
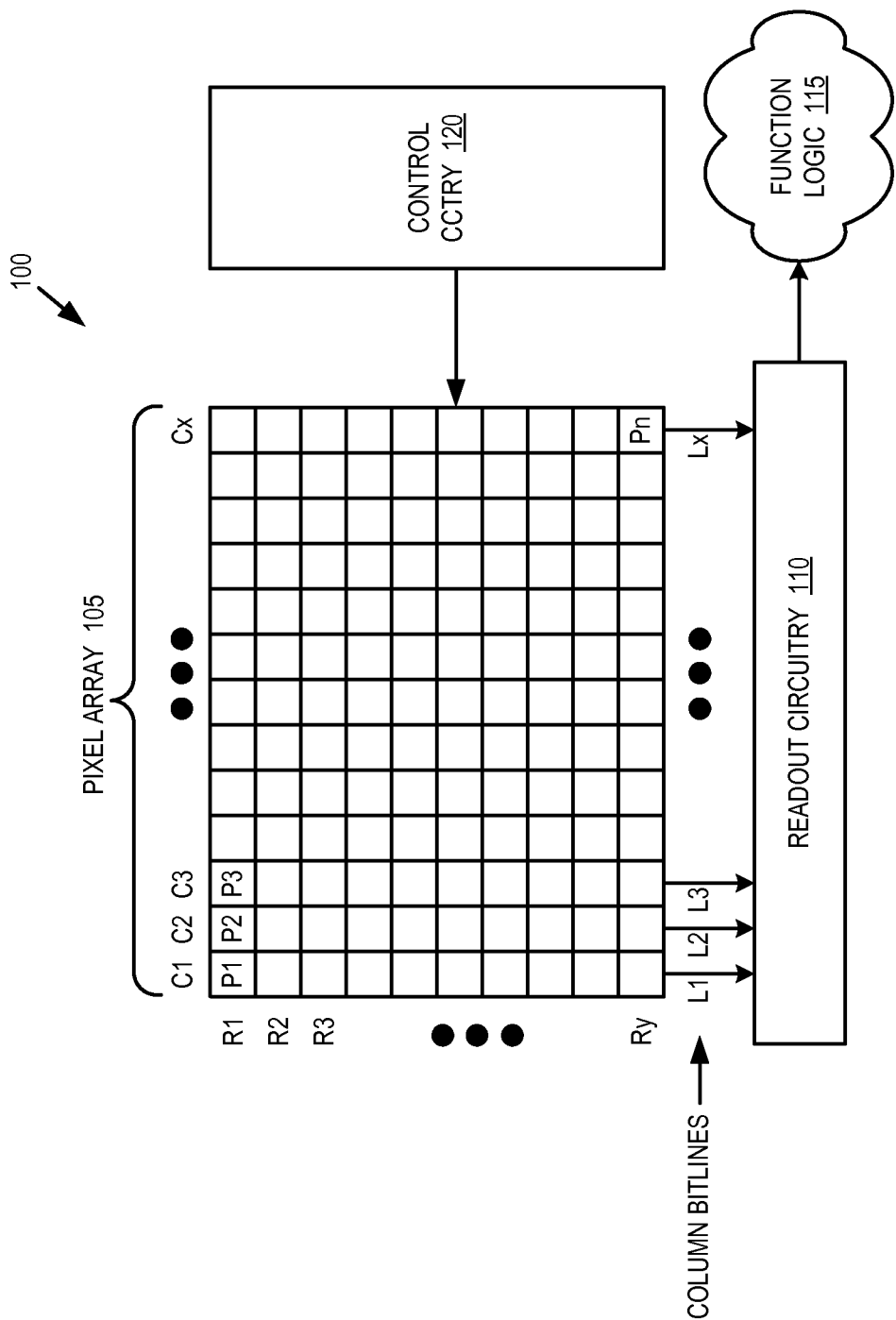
FIG. 1 is a functional block diagram illustrating an imaging sensor with missing code redistribution, in accordance with an embodiment of the invention.

FIG. 1 is a functional block diagram illustrating an imaging sensor 100 having a pipeline ADC with missing code redistribution, in accordance with an embodiment of the invention. The illustrated embodiment of imaging sensor 100 includes a pixel array 105, readout circuitry 110, function logic 115, and control circuitry 120.

Pixel array 105 is a two-dimensional ("2D") array of imaging pixels (e.g., pixels P1, P2 . . . , Pn). In one embodiment, each pixel is an imaging pixel of an active pixel sensor ("APS"), such as a complementary metal-oxide-semiconductor ("CMOS") imaging sensor. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 110 and transferred to function logic 115. Readout circuitry 110 may include sampling circuitry, amplification circuitry, pipeline ADC circuitry with missing code redistribution (as discussed below), or otherwise. Function logic 115 stores the image data or even manipulates the image data by applying post image effects (e.g., crop, rotate, remove red eye, adjust brightness, adjust contrast, or otherwise). In one embodiment, readout circuitry 110 may readout a row of image data at a time along column bitlines (illustrated) or may readout the image data using a variety of other techniques (not illustrated).

Control circuitry 120 is coupled to pixel array 105 to control operational characteristic of pixel array 105. For example, control circuitry 120 may generate a shutter signal for controlling image acquisition.

Figure 2:
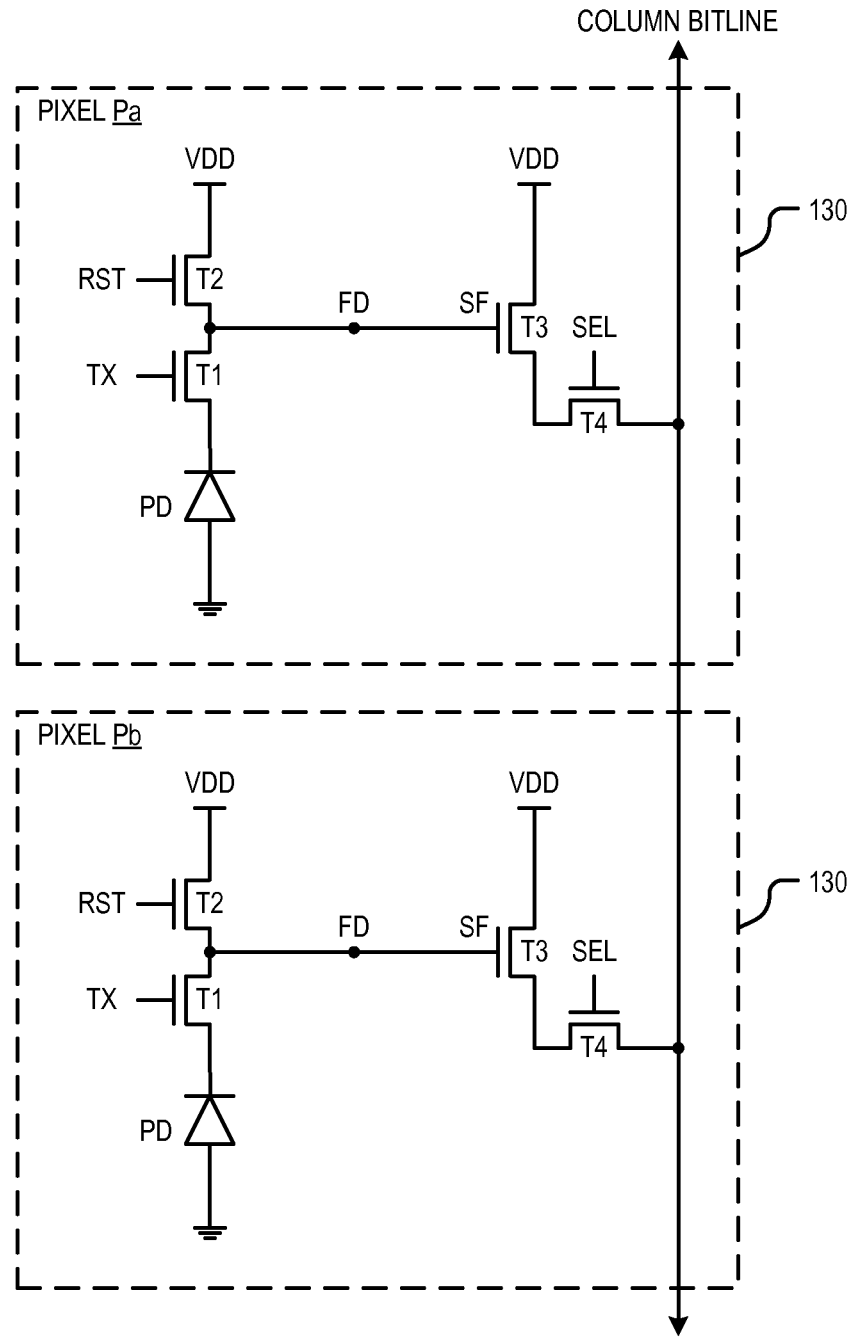
FIG. 2 is a circuit diagram illustrating pixel circuitry of two four-transistor ("4T") pixels within an imaging pixel array, in accordance with an embodiment of the invention.

FIG. 2 is a circuit diagram illustrating pixel circuitry 130 of two four-transistor ("4T") pixels within an imaging pixel array, in accordance with an embodiment of the invention. Pixel circuitry 130 is one possible pixel circuitry architecture for implementing each pixel within pixel array 100 of FIG. 1. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel circuitry architectures.

In FIG. 2, pixels Pa and Pb are arranged in two rows and one column. The illustrated embodiment of each pixel circuitry 130 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD (e.g., light level signal) to a floating diffusion node FD.

Reset transistor T2 is coupled between a power rail VDD and the floating diffusion node FD to reset by discharging or charging the FD to a preset voltage (e.g., black level signal) under control of a reset signal RST. The floating diffusion node FD is coupled to the gate of SF transistor T3. SF transistor T3 is coupled between the power rail VDD and select transistor T4. SF transistor T3 operates as a source-follower providing a high impedance output from floating diffusion node FD (e.g., buffering light or black level signal). Finally, select transistor T4 selectively couples the output of pixel circuitry 130 to the column bitline under control of a select signal SEL (e.g., reading light or black level signal). In one embodiment, the TX signal, the RST signal, and the SEL signal are generated by control circuitry 120.

Figure 3:
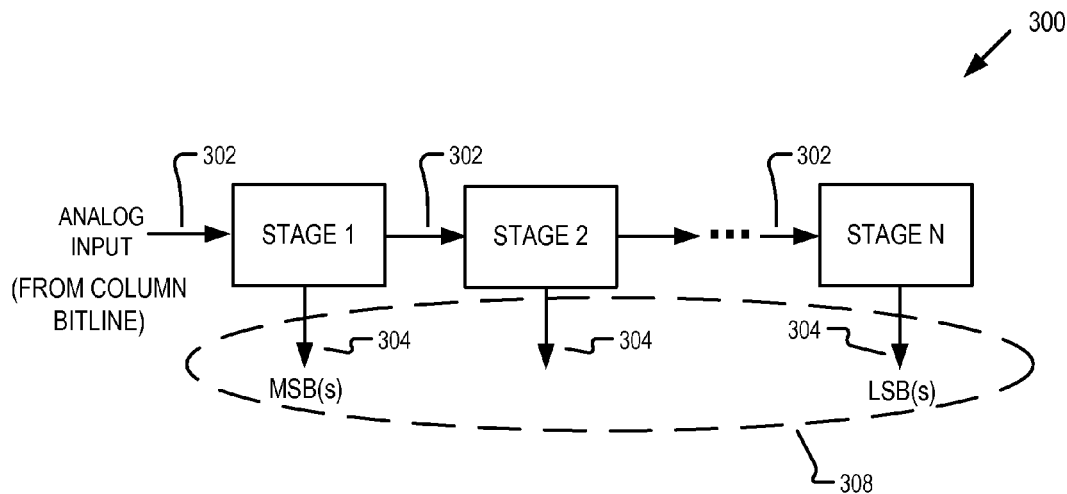
FIG. 3 is a functional block diagram illustrating a pipeline analog to digital converter (ADC), in accordance with an embodiment of the invention.

FIG. 3 is a functional block diagram illustrating a pipeline ADC 300 with missing code redistribution, in accordance with an embodiment of the invention. Pipeline ADC 300 is one possible implementation of analog to digital conversion circuitry included in readout circuitry 110 of FIG. 1 for digitizing the pixel outputs from pixel array 105. The illustrated embodiment of pipeline ADC 300 includes a plurality of stages (i.e., stage 1 through stage N), where each stage receives an analog input 302 and outputs a digital signal 304. In one embodiment, the analog input 302 of stage 1 is the pixel output read from the column bitline of a pixel array, such as bitlines L1, L2, or L3 of FIG. 1. Each stage of pipeline ADC 300 is configured to resolve (i.e., quantize) their respective analog input signal 302. In one embodiment, the combined digital signals 304 from each stage may be regarded as the digital output 308 of pipeline ADC 300 including a most significant bit (MSB) and a least significant bit (LSB). Pipeline ADC 300 may optionally include an encoder (not shown) coupled to receive the digital signals 304 and combine them into digital output 308. Thus, each digital signal 304 is representative of a portion of digital output 308 of the pipeline ADC 300. The number of stages included in pipeline ADC 300 may depend, in part, on the desired resolution of digital output 308 and the number of bits resolved by each stage. In the illustrated embodiment, pipeline ADC 300 includes circuitry (described below) to redistribute errors in the digital output 308.

Figure 4:
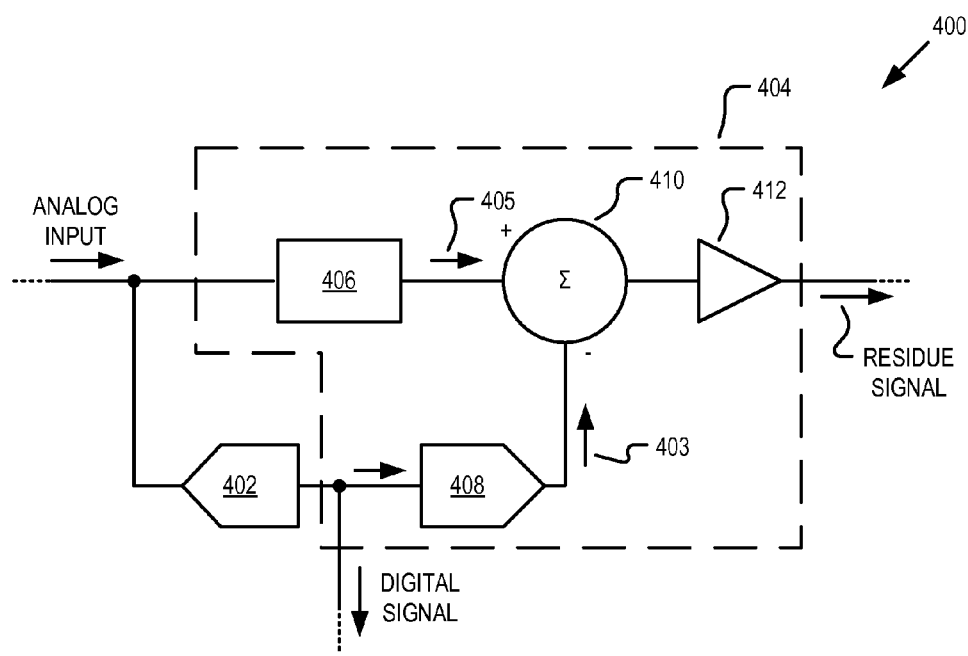
FIG. 4 is a functional block diagram illustrating a pipeline ADC stage, in accordance with an embodiment of the invention.

FIG. 4 is a functional block diagram illustrating a stage 400 of a pipeline ADC, in accordance with an embodiment of the invention. Stage 400 is one possible implementation of any stage of pipeline ADC 300 of FIG. 3. The illustrated embodiment of stage 400 includes a sub-analog to digital converter (sub-ADC) 402 and a multiplying digital to analog converter (MDAC) 404. MDAC 404 is illustrated as including a sample and hold circuit 406, a digital to analog converter DAC 408, a summing circuit 410, and an amplifier 412.

In operation, the analog input is sampled and held by sample and hold circuit 406, while the sub-ADC 402 quantizes the analog input. In one embodiment, the sub-ADC 402 quantizes the analog input to two bits. The quantized output of sub-ADC 402 is then output as a digital signal. Thus, the digital signal may represent a portion (e.g., one or more bits) of the digital output of the pipeline ADC. As shown in FIG. 4, the digital signal is also coupled to be received by DAC 408, where the digital signal is converted into an analog signal 403. Summing circuit 410 then subtracts analog signal 403 from analog signal 405 that was held in sample and hold circuit 406. The output of summing circuit 410 is then amplified by amplifier 412 to produce a residue signal. In one embodiment, amplifier 412 has a gain of two. The residue signal, output by stage 400, may be the analog input to a next stage of the pipeline ADC.

When stage 400 finishes quantizing the analog input to produce the digital signal and when stage 400 finishes passing the associated residue signal to the next stage, stage 400 may then begin processing a next analog input. That is, stage 400 need not wait for all stages of the pipeline ADC to complete their processing before stage 400 begins processing the next sample. It is this "pipelining" action that allows a relatively high throughput for most pipeline ADCs. However, component mismatch, gain errors, settling errors and inaccurate reference voltages may cause missing codes and degrade the quality of the digital output of a pipeline ADC. Missing codes may become even more pronounced with the errors that occur in the first few stages of the pipeline ADC. Component mismatch, such as capacitor mismatch may be difficult to overcome because of limitations on fabrication processes and/or circuit layout and may result in increased missing codes. For example, MDAC 404 may include a switched-capacitor gain amplifier (not shown), where the capacitors are mismatched, either within the gain amplifier itself, or relative to another stage. Thus, the residue signal output by stage 400 may be inaccurate. Similarly, a sub-ADC may include a comparator with a switched-capacitor network for quantizing the analog input where the quantized output (i.e., digital signal) is inaccurate because of component mismatch.

Figure 5A:
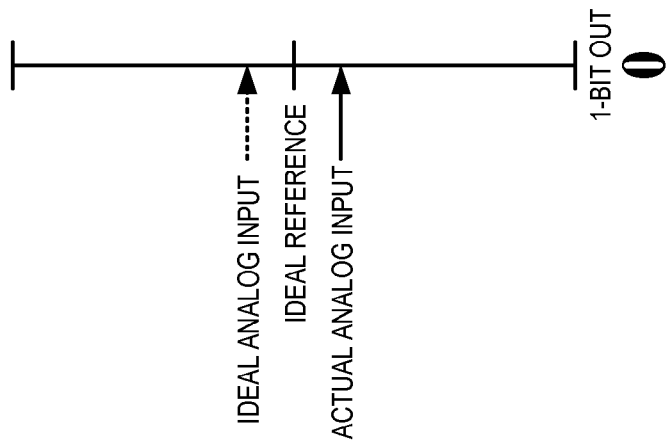
FIGS. 5A-5C illustrate the effects of component mismatch and inaccurate references in a comparator of a sub-ADC.
Figure 5B:
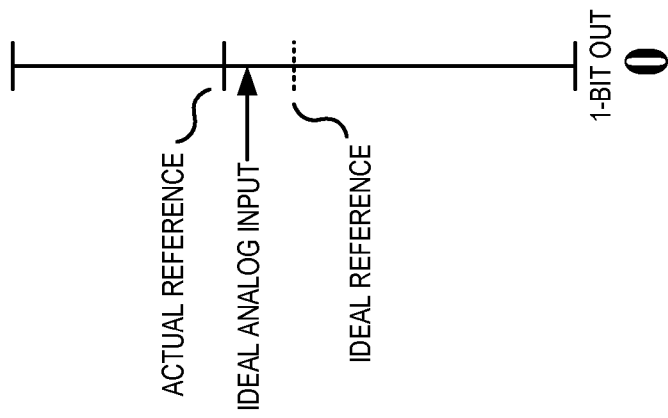
Figure 5C:
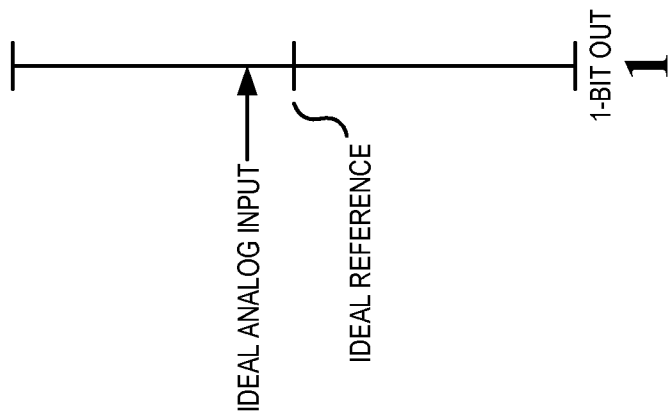

By way of example, FIGS. 5A-5C illustrate the effects of component mismatch and inaccurate references in a comparator of a sub-ADC. FIGS. 5A-5C illustrates a 1-BIT output of a comparator configured to compare an ideal analog input with an ideal reference. As shown in FIG. 5A, when the ideal analog input is greater than the ideal reference the output of the comparator is a logic "1". However, component mismatch may cause the actual reference to vary from the ideal reference. That is, the actual reference value used by the comparator may be different than the ideal reference intended by the circuit designer because of variances in the components. Thus, as shown in FIG. 5B, the shift in the actual reference away from the ideal reference causes the output of the comparator to register a logic "0" resulting is a missing code or error in the digital output of the pipeline ADC. Similarly, the actual analog input received by the comparator may shift away from the ideal analog input also because of component mismatch. Thus, FIG. 5C further illustrates a missing code at the output of the comparator because of the shift in the analog input due to component mismatch.

As mentioned above, missing codes may degrade the quality of the digital output of a pipeline ADC. In the embodiment where the pipeline ADC is utilized in the readout circuitry of an image sensor, the missing codes result in visually noticeable defects in the images that are output by the image sensor. Accordingly, embodiments of the pipeline ADC disclosed herein apply a randomized offset to an input of the comparator included in the sub-ADC to redistribute errors in the digital output of the pipeline ADC. Thus, in the embodiment where the pipeline ADC is included in an image sensor, missing codes (or errors) in the resultant image become less visible or invisible. FIG. 5D illustrates the effects of a random offset applied to an input of a comparator of a sub-ADC, in accordance with an embodiment of the invention. As shown in embodiment of FIG. 5D, a random offset is applied to an input of the comparator to redistribute errors in the digital output of the pipeline ADC. In the illustrated example, the random offset is limited by +/−one-fourth the ideal reference. Thus, for analog inputs that are relatively close to the ideal reference, the 1-BIT output of the comparator is randomized to account for missing codes due to component mismatches. Statistically, the number of missing codes with the randomized offset is similar to the number of missing codes without the randomized offset. However, as stated above, applying the randomized offset redistributes the missing codes in the digital output such that they are less noticeable or even imperceptible.

Figure 6:
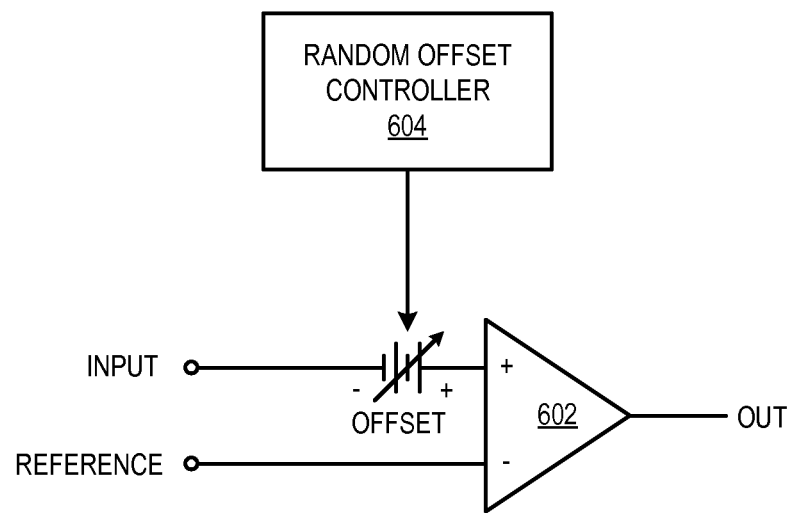
FIG. 6 is a functional block diagram illustrating a comparator and random offset controller of a sub-ADC, in accordance with an embodiment of the invention.

FIG. 6 is a functional block diagram illustrating a comparator 602 and random offset controller 604 of a sub-ADC, in accordance with an embodiment of the invention. In one embodiment, comparator 602 and random offset controller 604 are included in the sub-ADC 402 of FIG. 4 for quantizing at least one bit of the analog input. That is, INPUT may be coupled to receive an analog input, while REFERENCE is coupled to receive a reference signal for comparison thereto. As shown in FIG. 6, random offset controller 604 is coupled to comparator 602 to apply a random offset voltage to an input of the comparator to redistribute errors by the sub-ADC in digital outputs of the pipeline ADC. Although FIG. 6 illustrates random offset controller 604 as applying a random offset voltage to the non-inverting input of comparator 602, the random offset voltage may be similarly applied to the inverting input of comparator 602 or may also be a differential voltage applied to both inputs.

In the embodiment of FIG. 6, when the INPUT (i.e., analog input) plus the OFFSET (i.e., offset voltage) is greater than the REFERENCE, then the output of comparator is HIGH (i.e., logic "1"). Similarly, when the INPUT plus the OFFSET is less than the REFERENCE, then the output of the comparator is LOW (i.e., logic "0"). The value of the randomized OFFSET may be limited to ensure that randomization of the output of comparator 602 occurs only when the INPUT is relatively close to the REFERENCE. Thus, in one embodiment, the OFFSET is limited to $$\pm \frac{1}{4} \text{REFERENCE.}$$

Figure 7:
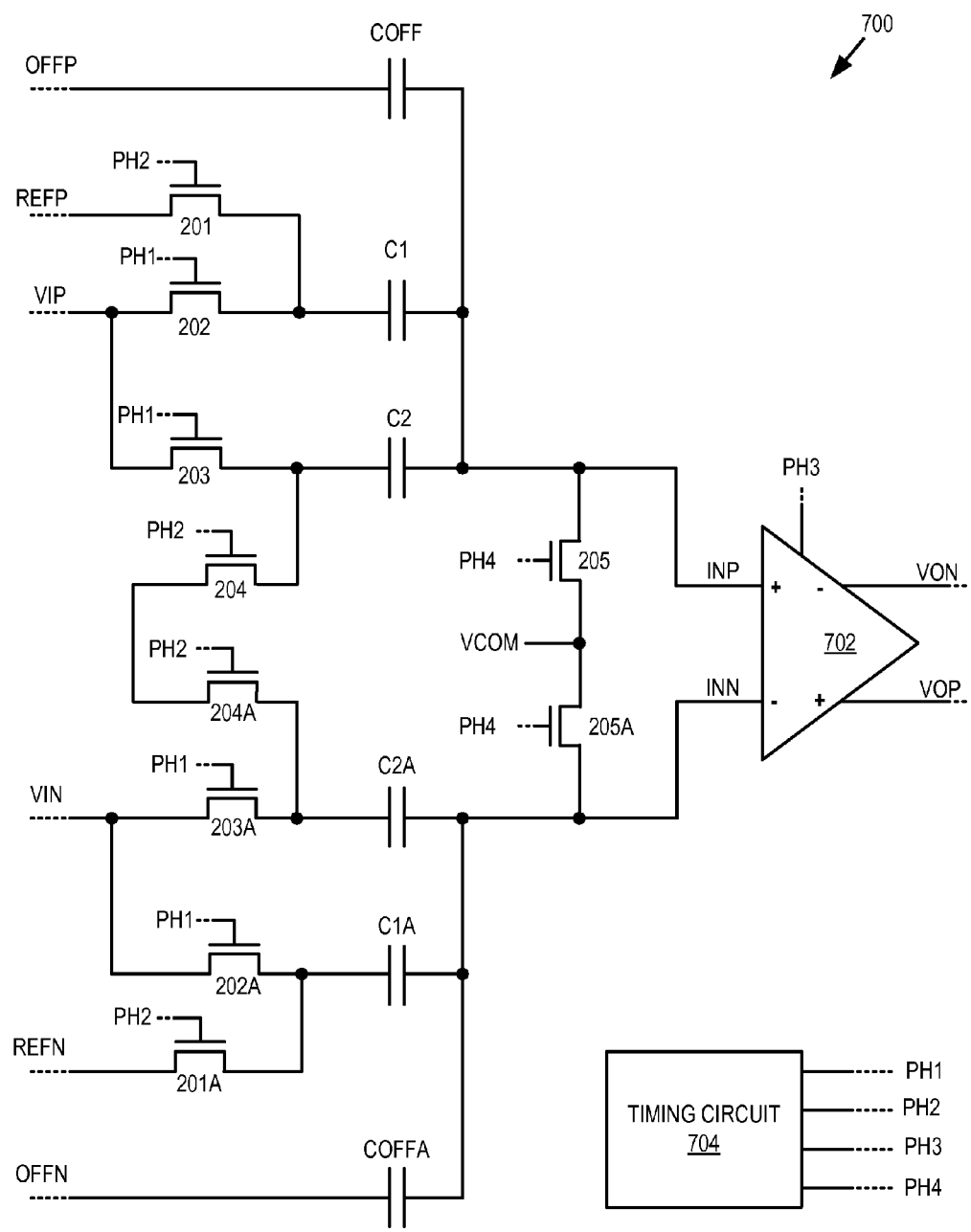
FIG. 7 is a functional block diagram illustrating a switched capacitor circuit having a dynamic comparator for a sub-ADC, in accordance with an embodiment of the invention.

FIG. 7 is a functional block diagram illustrating a switched capacitor circuit 700 having a dynamic comparator 702 for a sub-ADC, in accordance with an embodiment of the invention. In one embodiment, switched capacitor circuit 700 is included in the sub-ADC 402 of FIG. 4 for quantizing at least one bit of the analog input. The illustrated example of switched capacitor circuit 700 includes dynamic comparator 702, a timing circuit 704, a reset circuit, offset capacitors COFF and COFFA, and a switched-capacitor (SC) network. The SC network includes capacitors C1, C1A, C2, and C2A, and switches 201, 201A, 202, 202A, 203, 203A, 204, and 204A. The reset circuit includes switches 205 and 205A coupled to a common voltage VCOM.

Figure 9:
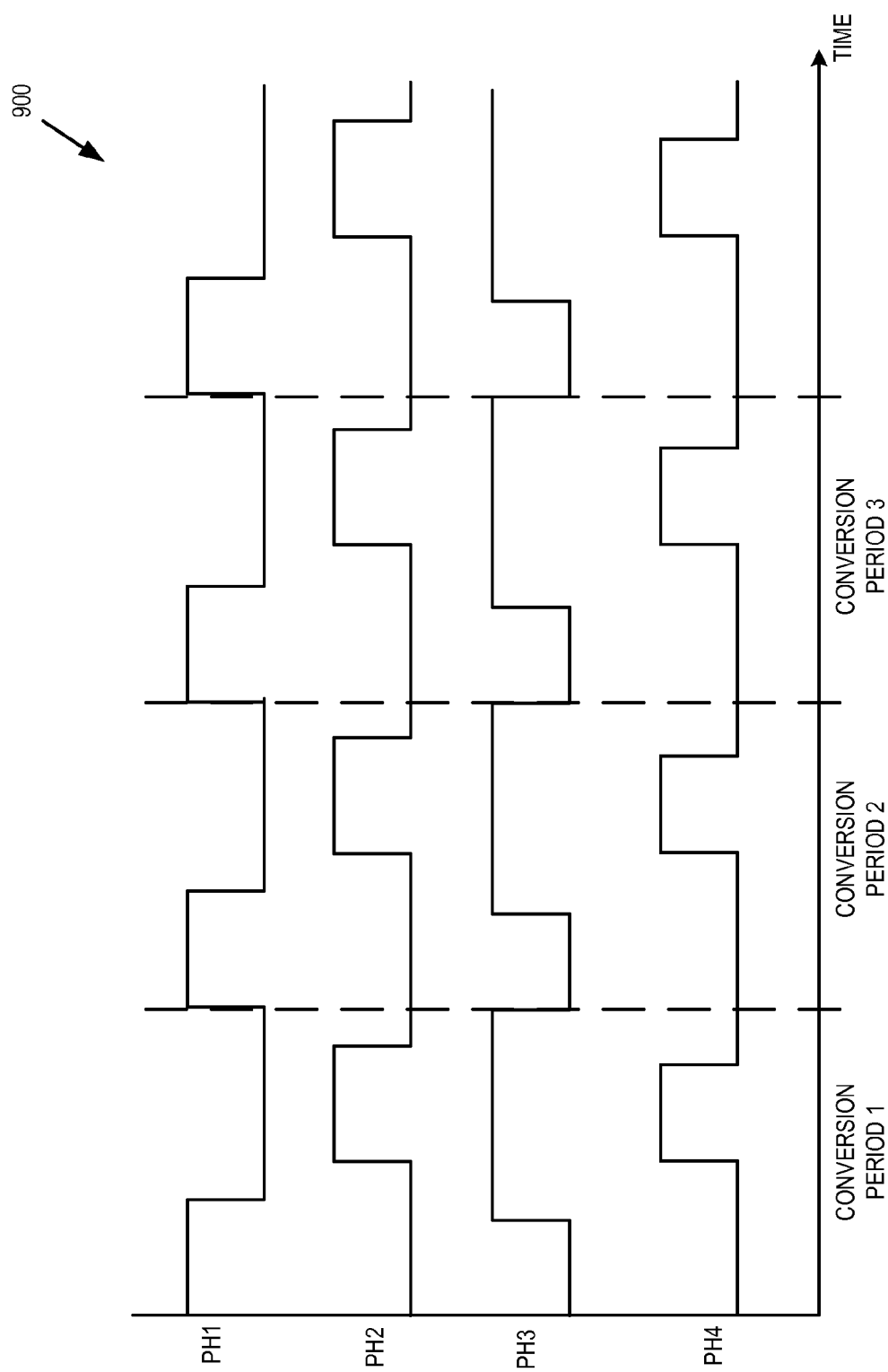
FIG. 9 is a timing diagram illustrating several timing signals of the switched capacitor circuit of FIG. 7.

The illustrated SC network is coupled to differential inputs INP and INN of dynamic comparator 702. Each switch of the SC network is controlled by one of two-phase clock signals PH1 and PH2 generated by timing circuit 704. Clock signals PH1 and PH2 are non overlapping, as illustrated in FIG. 9. Switches 201, 202, 201A and 202A alternately sample differential input signals VIP and VIN and differential reference voltages REFN and REFP into capacitors C1 and C1A. Switches 203, 204, 203A and 204A alternately sample differential input signals VIP and VIN into capacitors C1 and C1A respectively and equalize capacitors C1 and C1A. Switches 205 and 205A selectively couple differential inputs INP and INN of dynamic comparator 702 to common mode voltage VCOM, which resets the differential input of dynamic comparator 702. Control signal PH4 control switches 205 and 205A while control signal PH3 controls dynamic comparator 206. In one embodiment, dynamic comparator 702 is configured to be enabled when PH3 is HIGH and to reset the differential outputs VON and VOP when PH3 is LOW. Although not shown, switched capacitor circuit 700 may optionally include a level shifter coupled to the output of dynamic comparator 702 to convert the differential output VOP−VON into a logic level.

For ease of explanation, the INPUT, as described with reference to FIG. 6, is substantially equal to VIP−VIN. Similarly, REFERENCE is substantially equal to REFP−REFN and OFFSET is substantially equal to OFFP−OFFN. Thus, the differential output VOP−VON of dynamic comparator 702 is representative of:

(a.) a logic HIGH, when A1*(VIP−VIN)+A2*(OFFP−OFFN)>A3*(REFP−REFN); and (b.) a logic LOW, when A1*(VIP−VIN)+A2*(OFFP−OFFN)<A3*(REFP−REFN), wherein A1, A2, and A3 are the respective gains provided by the SC network. In the illustrated example, gain A1 is substantially determined by:

$$A1 = \frac{(C1 + C2)}{(C1 + C2 + COFF)}.$$

Gain A2 may be determined by:

$$A2 = \frac{COFF}{(C1 + C2 + COFF)},$$

and gain A3 may be determined by:

$$A3 = \frac{C1}{(C1 + C2 + COFF)}.$$

However, as stated above capacitor mismatch is a problem because of limitations on fabrication processes and/or circuit layout. As a result, the gains A1, A2, and A3 will vary as the capacitors vary during fabrication. Accordingly, offset capacitors COFF and COFFA are coupled to provide a random differential offset voltage to the inputs INP and INN of dynamic comparator 702 to redistribute errors in the digital outputs of the pipeline ADC. In one embodiment, the offset voltage is accumulated across the offset capacitors COFF and COFFA and may be proportional to OFFP-OFFN, where a magnitude of OFFP-OFFN is less than a magnitude of one-fourth (REFP-REFN). In one embodiment offset signals OFFP and OFFN are generated by a random offset controller circuit, such as the embodiment of random offset controller circuit 800 illustrated in FIG. 8.

Figure 8:
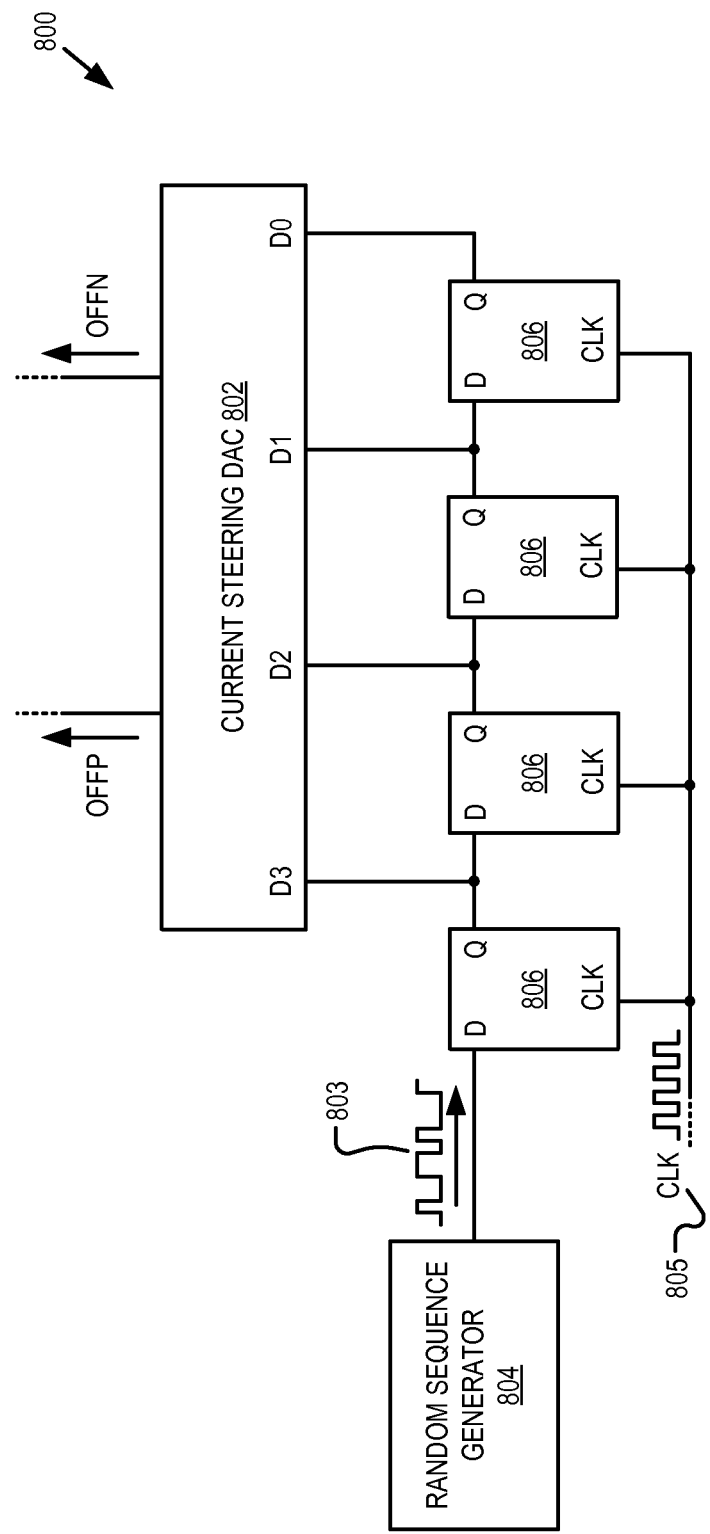
FIG. 8 is a functional block diagram illustrating a random offset controller circuit, in accordance with an embodiment of the invention.

In FIG. 8, the illustrated random offset controller circuit 800 includes a current steering DAC 802, a random sequence generator 804, and a plurality of D-type flip-flops 806. Random sequence generator 804 is configured to generate a random sequence 803 of bits. The random sequence 803 is then applied to the input of flip-flop 806. Clock signal CLK 805 is coupled to the flip-flops 806 to shift the random sequence through the flip-flops, such that each of the digital inputs (D0-D3) of the current steering DAC 802 receive at least one of the bits of random sequence 803. Current steering DAC 802 then generates offset signals OFFP and OFFN to generate the offset voltage across the inputs of a comparator, such as dynamic comparator 702 of FIG. 7. In one embodiment, offset signals OFFP and OFFN are voltage signals coupled to charge the offset capacitors COFF and COFFA, respectively, such that a differential offset voltage appears across the differential inputs INP and INN of dynamic comparator 702. Although, FIG. 8 illustrates four D-type flip-flops 806 and four inputs to current steering DAC 802, it is realized that any number of flip-flops and corresponding inputs to current steering DAC 802 may be utilized depending on the resolution desired for the offset voltage. In the illustrated embodiment, with four inputs to current steering DAC 802, 16 discrete values of the offset are permissible for redistribution of errors in the sub-ADC. Furthermore, although FIG. 8 illustrates random sequence generator 804 as generating a serial random sequence 803, it is realized that random sequence generator 804 may include a parallel output for providing a random set of bits directly to current steering DAC 802 without the need for flip-flops 806.

FIG. 9 is a timing diagram illustrating several timing signals of the switched capacitor circuit 700 of FIG. 7. FIG. 9 further illustrates several conversion periods of the switched capacitor circuit 700. That is, VIP–VIN is converted into a single bit in conversion period 1. A next analog input (VIP–YIN) is then converted into a bit in conversion period 2. In one embodiment, the random offset applied to the input of the dynamic comparator may change at each conversion period. For example, referring back to FIG. 8, clock signal 805 may pulse once each conversion period such that the random sequence 803 shifts through the flip-flops 806, thereby changing the input to the current steering DAC 802 and the resultant offset signals OFFP and OFFN.

Figure 10:
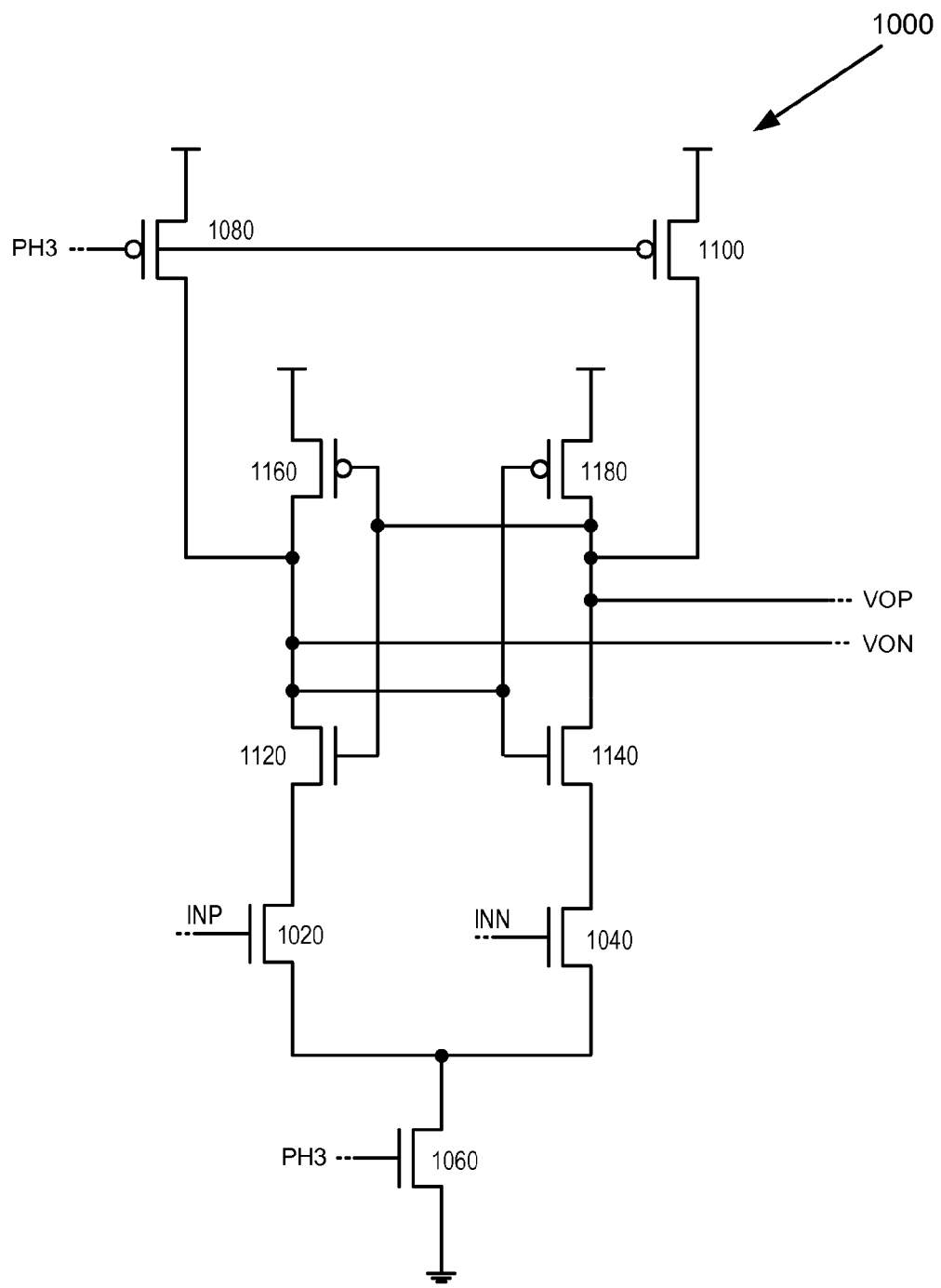
FIG. 10 is a circuit diagram of a dynamic comparator for a sub-ADC, in accordance with an embodiment of the invention.

FIG. 10 is a circuit diagram of a dynamic comparator 1000 for a sub-ADC, in accordance with an embodiment of the invention. Dynamic comparator 1000 is one possible implementation of dynamic comparator 702 of FIG. 7. The illustrated example of dynamic comparator 1000 includes transistors 1020-1180. As shown in FIG. 10, input transistor 1020 includes a gate terminal that is coupled to provide the INP input of the dynamic comparator 1000. Similarly, input transistor 1040 includes a gate terminal that is coupled to provide the INN input. Dynamic comparator 1000 further includes a transistor 1060 coupled to the input transistors 1020 and 1040 for coupling their source terminals to a common reference (e.g., ground) in response to timing signal PH3. Dynamic comparator 1000 also includes reset transistors 1080 and 1100 to reset the differential outputs VOP and VON in response to timing signal PH3.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A pipeline analog to digital converter (ADC), comprising:
 a plurality of stages, wherein at least one of the stages comprises:
  a sub-analog to digital converter (sub-ADC) coupled to convert a first analog signal into a digital signal, wherein the digital signal is representative of a portion of a digital output of the pipeline ADC; and
  a multiplying digital to analog converter (MDAC) coupled to the sub-ADC to convert the digital signal into a second analog signal and to generate a residue signal representative of a difference between the first analog signal and the second analog signal, wherein the sub-ADC includes:
   a comparator coupled to compare the first analog signal to a reference signal; and
   a random offset controller coupled to the comparator to apply a random offset to an input of the comparator to randomly redistribute errors by the sub-ADC in digital outputs of the pipeline ADC.

2. The pipeline ADC of claim 1, wherein the input of the comparator is a first input, the comparator further comprising a second input and wherein the random offset controller is coupled to apply a random offset voltage between the first and second inputs.

3. The pipeline ADC of claim 2, wherein the random offset controller further includes:
 a random sequence generator configured to generate the random sequence;
 a flip-flop coupled to the random sequence generator to store at least one bit of the random sequence; and
 a digital to analog converter coupled to receive the at least one bit stored in the flip-flop and to generate the random offset voltage in response thereto.

4. The pipeline ADC of claim 2, wherein the sub-ADC further comprises:
 a timing circuit coupled to generate a plurality of timing signals; and
 a switched-capacitor (SC) network coupled to the first and second inputs of the comparator and controlled by the plurality of timing signals.

5. The pipeline ADC of claim 2, wherein the offset voltage is less than one-fourth the reference signal.

6. A pipeline analog to digital converter (ADC), comprising:
 a plurality of stages, wherein at least one of the stages comprises:
  a sub-analog to digital converter (sub-ADC) coupled to convert a first analog signal into a digital signal, wherein the digital signal is representative of a portion of a digital output of the pipeline ADC; and
  a multiplying digital to analog converter (MDAC) coupled to the sub-ADC to convert the digital signal into a second analog signal and to generate a residue signal representative of a difference between the first analog signal and the second analog signal, wherein the sub-ADC includes:
- a dynamic comparator coupled to compare the first analog signal to a reference signal;
- a first offset capacitor coupled to a first input of the dynamic comparator;
- a second offset capacitor coupled to a second input of the dynamic comparator;
- a random sequence generator configured to generate a random sequence;
- a current steering digital to analog converter (DAC) coupled to provide a first offset signal to the first offset capacitor and to provide a second offset signal to the second offset capacitor in response to the random sequence to generate a random offset voltage between the first and second inputs of the dynamic comparator to randomly redistribute errors by the sub-ADC in digital outputs of the pipeline ADC.

7. The pipeline ADC of claim 6, wherein the random offset controller further includes a plurality of flip-flops coupled between the random sequence generator and the current steering DAC to store and provide bits of the random sequence to the current steering DAC.

8. The pipeline ADC of claim 6, wherein the sub-ADC further comprises:
- a timing circuit coupled to generate a plurality of timing signals; and
- a switched-capacitor (SC) network coupled to the first and second inputs of the dynamic comparator, wherein the SC network and the dynamic comparator are controlled by the plurality of timing signals.

9. The pipeline ADC of claim 8, wherein the dynamic comparator comprises:
- a first transistor having a gate coupled to the first input of the dynamic comparator;
- a second transistor having a gate coupled to the second input of the dynamic comparator; and
- a switch configured to coupled source terminals of the first and second transistors to a common reference in response to at least one of the plurality of timing signals.

10. The pipeline ADC of claim 8, wherein the dynamic comparator further comprises:
- a pair of differential outputs; and
- at least one switch configured to reset the differential outputs in response to at least one of the plurality of timing signals.

11. The pipeline ADC of claim 6, wherein the offset voltage is less than one-fourth the reference signal.

12. An imaging sensor, comprising:
a plurality of imaging pixels arranged in a column;
readout circuitry including a pipeline analog to digital converter (ADC) coupled to the column to convert analog signals received from the imaging pixels into a digital output, the pipeline ADC comprising:
a plurality of stages, wherein at least one of the stages comprises:
- a sub-analog to digital converter (sub-ADC) coupled to convert a first analog signal into a digital signal, wherein the digital signal is representative of a portion of the digital output; and
- a multiplying digital to analog converter (MDAC) coupled to the sub-ADC to convert the digital signal into a second analog signal and to generate a residue signal representative of a difference between the first analog signal and the second analog signal, wherein the sub-ADC includes:
  - a comparator coupled to compare the first analog signal to a reference signal; and
  - a random offset controller coupled to the comparator to apply a random offset to an input of the comparator to randomly redistribute errors by the sub-ADC in the digital output of the pipeline ADC.

13. The imaging sensor of claim 12, wherein the input of the comparator is a first input, the comparator further comprising a second input and wherein the random offset controller is coupled to apply a random offset voltage between the first and second inputs.

14. The imaging sensor of claim 13, wherein the random offset controller further includes:
- a random sequence generator configured to generate the random sequence;
- a flip-flop coupled to the random sequence generator to store at least one bit of the random sequence; and
- a digital to analog converter coupled to receive the at least one bit stored in the flip-flop and to generate the random offset voltage in response thereto.

15. The imaging sensor of claim 13, wherein the sub-ADC further comprises:
- a timing circuit coupled to generate a plurality of timing signals; and
- a switched-capacitor (SC) network coupled to the first and second inputs of the comparator and controlled by the plurality of timing signals.

16. The imaging sensor of claim 13, wherein the offset voltage is less than one-fourth the reference signal.

* * * * *